United States Patent
Gonzalez et al.

(10) Patent No.: US 12,267,946 B2
(45) Date of Patent: Apr. 1, 2025

(54) POWER DELIVERY NETWORK NOISE ISOLATION IN A COMPUTING DEVICE

(71) Applicant: QUALCOMM INCORPORATED, San Diego, CA (US)

(72) Inventors: Jason Gonzalez, Solana Beach, CA (US); Lili Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 376 days.

(21) Appl. No.: 17/673,347

(22) Filed: Feb. 16, 2022

(65) Prior Publication Data

US 2023/0262874 A1 Aug. 17, 2023

(51) Int. Cl.
*H05K 1/02* (2006.01)
*G06F 1/28* (2006.01)
*H05K 1/11* (2006.01)
*H05K 1/18* (2006.01)

(52) U.S. Cl.
CPC ............ *H05K 1/0216* (2013.01); *G06F 1/28* (2013.01); *H05K 1/112* (2013.01); *H05K 1/181* (2013.01)

(58) Field of Classification Search
CPC ...... H05K 1/02; H05K 1/0213; H05K 1/0224; H05K 1/0253; H05K 1/11; H05K 1/112; H05K 1/18; H05K 1/181–187
USPC ......... 361/760, 767, 774–778, 792–795, 803
See application file for complete search history.

(56) References Cited

U.S. PATENT DOCUMENTS

| | | | | |
|---|---|---|---|---|
| 5,278,524 A * | 1/1994 | Mullen | ................ | H05K 1/0219 361/792 |
| 5,912,809 A * | 6/1999 | Steigerwald | ......... | H05K 1/0262 174/262 |
| 5,964,854 A | 10/1999 | Roozenbeek et al. | | |
| 6,335,494 B1 * | 1/2002 | Gregor | ................ | H05K 1/0216 257/E23.079 |
| 6,388,208 B1 * | 5/2002 | Kiani | .................. | H05K 1/0222 174/266 |
| 6,995,320 B2 * | 2/2006 | Kusakabe | ............... | H01L 24/06 257/E23.079 |
| 7,088,711 B2 * | 8/2006 | Goergen | ............. | H05K 1/0248 370/360 |

(Continued)

FOREIGN PATENT DOCUMENTS

WO 2011111737 A1 9/2011

OTHER PUBLICATIONS

Related PCT Pat. App. Ser. No. PCT/US2023/060997, filed Jan. 20, 2023, entitled, Power Delivery Network Noise Isolation in a Computing Device, International Search Report and Written Opinion of the International Searching Authority (EPO), transmitted on Jun. 9, 2023, 13pages.

*Primary Examiner* — Tuan T Dinh
(74) *Attorney, Agent, or Firm* — Smith Tempel Blaha LLC/Qualcomm (57) ABSTRACT

A system for power delivery network ("PDN") isolation includes a multi-layer printed circuit board ("PCB") in which a power distribution layer has a root conductive region and two or more branch conductive regions fanning out from the root conductive region. Each branch conductive region is insulated from other branch conductive regions by a non-conductive region. Each branch conductive region has at least one power delivery connection. Each of various electronic circuits mounted on the PCB and sharing the same PDN may be shorted to one of the branch conductive regions.

21 Claims, 5 Drawing Sheets

(56) References Cited

U.S. PATENT DOCUMENTS

| | | | |
|---|---|---|---|
| 7,336,502 B1* | 2/2008 | Goergen | H05K 1/116 |
| | | | 361/780 |
| 7,589,787 B2* | 9/2009 | Shinomiya | H04N 25/709 |
| | | | 348/374 |
| 8,199,522 B2* | 6/2012 | Hsu | H05K 1/0231 |
| | | | 361/795 |
| 10,396,033 B1* | 8/2019 | Gupta | H01L 23/5286 |
| 2002/0176236 A1 | 11/2002 | Iguchi et al. | |
| 2004/0041938 A1* | 3/2004 | Seo | H04N 23/54 |
| | | | 348/340 |
| 2014/0160684 A1* | 6/2014 | Wittenberg | H01L 23/34 |
| | | | 174/252 |
| 2020/0411495 A1* | 12/2020 | Hovis | G06F 1/183 |

* cited by examiner

POWER DELIVERY NETWORK NOISE ISOLATION IN A COMPUTING DEVICE

DESCRIPTION OF THE RELATED ART

A computing device may include multiple subsystems, cores, or other components. Such a computing device may be, for example, a portable computing device ("PCD"), such as a laptop or palmtop computer, a cellular telephone or smartphone, portable digital assistant, portable game console, etc. The multiple subsystems, cores or other components of a computing device may be included within the same integrated circuit chip or in different chips. A "system-on-a-chip" or "SoC" is an example of one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other processing subsystems, such as a transceiver or "modem" subsystem that provides wireless connectivity, a memory subsystem, etc.

An SoC and/or one or more other types of chips may be mounted on a printed circuit board ("PCB"). The PCB may have multiple layers. One or more of the PCB layers may comprise a power plane, through which power is supplied to chip subsystems or other chip circuits. As a power plane comprises abroad, conductive (i.e., metal) region, it advantageously provides a low-impedance path from the connection between the power supply and the power plane to each connection between the power plane and a chip. A power plane may be configured to supply power to more than one chip or more than one subsystem of an SoC. The paths from a power supply to the chip power connections may collectively be referred to as a power delivery network.

Operation of some types of subsystems may induce noise on the power supply connection between the power plane and such a subsystem, and the low-impedance path from that connection to other connections between the power plane and other subsystems may transmit noise to the connections between the power plane and such other subsystems. The performance of some types of subsystems may be adversely affected by noise (i.e., AC current and voltage fluctuations) on their power supply voltages. Noise suppression techniques may be employed to help reduce overall power delivery network impedance, such as adding capacitance on a chip (die), in a chip package, or on the PCB. Nevertheless, it would be desirable to further improve power supply noise suppression or isolation.

SUMMARY OF THE DISCLOSURE

Systems, methods, and other examples are disclosed for power delivery network isolation in a computing device.

An exemplary system for power delivery network isolation may include a printed circuit board comprising a plurality of planar layers. One of the layers may be a power distribution layer comprising a root conductive region and a plurality of branch conductive regions fanning out from the root conductive region. Each branch conductive region may be insulated from other branch conductive regions by a non-conductive region. Each branch conductive region may have at least one of a plurality of power delivery connections.

Another exemplary system for power delivery network isolation may include a printed circuit board comprising a plurality of planar layers, signal aggressor circuitry mounted on the printed circuit board, and signal victim circuitry mounted on the printed circuit board. One of the layers may be a power distribution layer comprising a root conductive region and a plurality of branch conductive regions coupled to the root conductive region. Each branch conductive region may be insulated from other branch conductive regions by a non-conductive region. Each branch conductive region may have at least one of a plurality of power delivery connections. The signal aggressor circuitry may have a first power receiving connection coupled to a first one of the power delivery connections. The signal victim circuitry may have a second power receiving connection coupled to a second one of the power delivery connections. The shortest conductive path from the first power receiving connection to the second power receiving connection through the root conductive region may be longer than the shortest direct path from the first power receiving connection to the second power receiving connection across at least one of the non-conductive regions.

Yet another exemplary system for power delivery network isolation may include a printed circuit board comprising a plurality of planar layers, power supply circuitry mounted on a top layer, and a system-on-a-chip ("SoC") mounted on the top layer. Another one of the layers may be a power distribution layer comprising a root conductive region and a plurality of branch conductive regions coupled to the root conductive region. Each branch conductive region may be insulated from other branch conductive regions by a non-conductive region. Each branch conductive region may have at least one of a plurality of power delivery connections. The power supply circuitry may have a power output coupled to the root conductive region. The SoC may have a plurality of subsystems. The power receiving connection of a first SoC subsystem may be coupled to a first one of the power delivery connections. Similarly, the power receiving connection of a second SoC subsystem may be coupled to a second one of the power delivery connections.

Still another exemplary system for power delivery network isolation may include means for receiving power from power supply circuitry on a printed circuit board, means for delivering the power to a plurality of circuits on the printed circuit board, and means for isolating noise from the power delivered to each of the plurality of circuits from the power delivered to others of the plurality of circuits.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
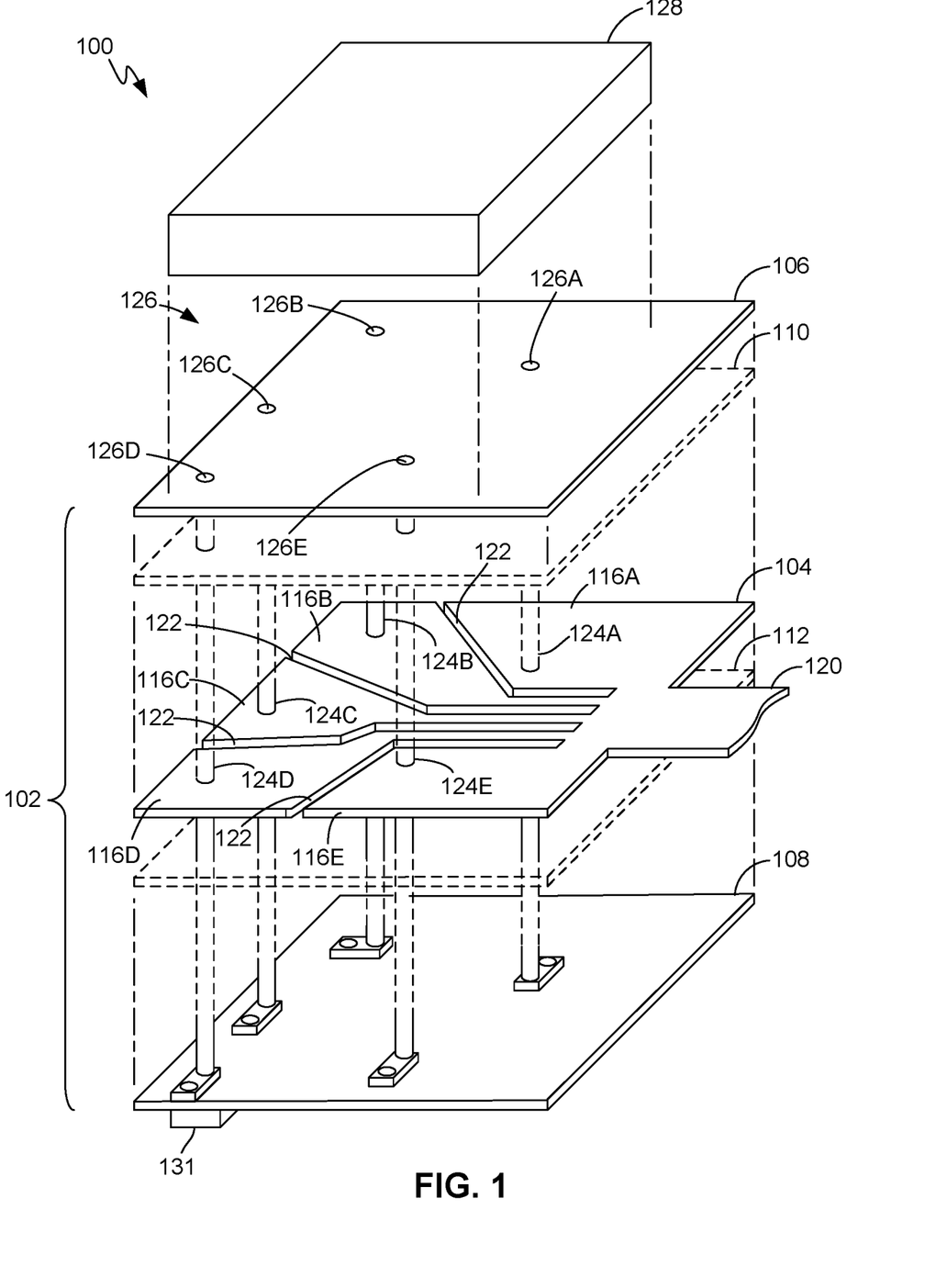
FIG. 1 is a perspective assembly view of a system for power delivery network isolation, in accordance with exemplary embodiments.
Figure 2:
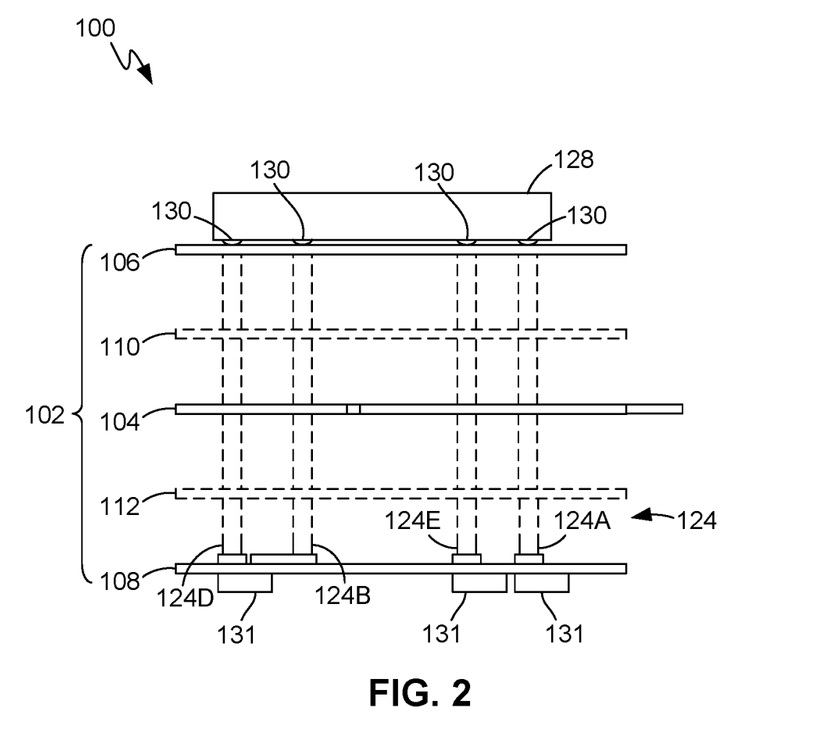
FIG. 2 is a side view of the system of FIG. 1.

As shown in FIGS. 1-2, in an illustrative or exemplary embodiment a system 100 for power delivery network isolation may include a printed circuit board ("PCB") 102. The PCB 102 may be a substantially planar, multi-layer structure. The PCB 102 may include a power distribution layer 104, a top layer 106, and a bottom layer 108. In some examples, the PCB 102 may further include one or more other layers 110 between the power distribution layer 104 and the top layer 106, one or more other layers 112 between the power distribution layer 104 and the bottom layer 108, or a combination of one or more layers 110 and 112. The terms "top" and "bottom" should not be construed as limiting the orientation, order, use or any other aspect of the PCB 102 or the system 100 and are used only for reference purposes to indicate opposing outer layers of the PCB 102. The power distribution layer 104 is not limited to be in between the top layer 106 and bottom layer 108. The power distribution layer 104 can be the top or bottom layer.

The power distribution layer 104 is an electrically conductive layer and may consist of metal, while one or more of the other layers may be electrically insulating layers and consist of electrically insulating material. The layers of the PCB 102 may be laminated or sandwiched together or otherwise formed together in a conventional manner, as understood by one of ordinary skill in the art. Each electrically conductive layer, such as the power distribution layer 104, may be formed on or against an electrically insulating layer or sandwiched between two electrically insulating layers. The power distribution layer 104 may be formed on or against (i.e., in contact with) an electrically insulating layer, but such contact between layers is not shown in the assembly view of FIG. 1 for purposes of clarity. Another example of an electrically conductive layer is a layer consisting of circuit signal traces (not shown). Still another example of an electrically conductive layer is a ground plane layer (not shown).

Although only the one power distribution layer 104 is shown for purposes of clarity, the PCB 102 may include more than one such power distribution layer. The descriptions herein with regard to the exemplary power distribution layer 104 apply to any such other power distribution layers. The exemplary power distribution layer 104 may be configured to carry a supply voltage, and other power distribution layers (not shown) may be configured to carry other supply voltages.

As used herein, the term "PCB" includes any type of multi-layer electrical circuit structure having one or more electrically conductive layers and one or more electrically insulating layers, laminated, sandwiched or otherwise formed together into a substantially planar circuit structure. The term "PCB" as used herein is not limited by the manufacturing process. For example, the term "PCB" as used herein is not limited to a "printed" structure or a "board" structure. Although in the illustrated embodiment the PCB 102 may be rigid like a board, in other embodiments such a PCB may be flexible.

Figure 3:
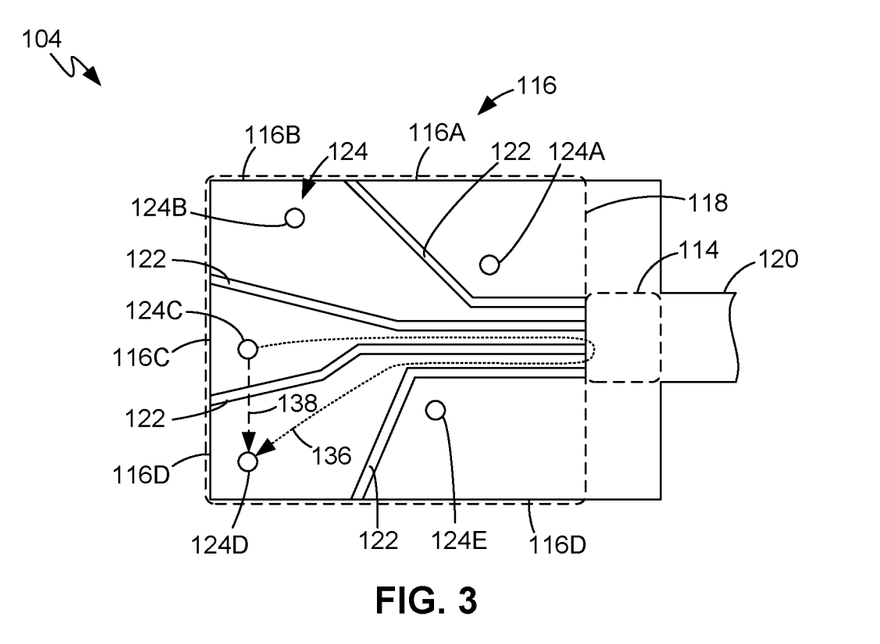
FIG. 3 is a top plan view of a power distribution layer of a printed circuit board of the system of FIGS. 1-2.

As further shown in FIG. 3, the power distribution layer 104 may consist of a root conductive region 114 and two or more branch conductive regions 116, such as a first branch conductive region 116A, a second branch conductive region 116B, a third branch conductive region 116C, a fourth branch conductive region 116D, and a fifth branch conductive region 116E, branching or fanning out from the root conductive region 114. Although five branch conductive regions 116 are shown, in other examples there may be any number greater than one. The branch conductive regions 116 may have peripheries of any shapes.

The branch conductive regions 116 may be bounded by a power delivery region 118 of the power distribution layer 104. That is, the power delivery region 118 represents the collective extent or outer peripheries of the branch conductive regions 116. The power delivery region 118 may have any shape. The power delivery region 118 may be, but is not necessarily in every example, coextensive with portions of the periphery of the power distribution layer 104. The power delivery region 118 is coupled to and immediately adjacent the root conductive region 114, thus providing a continuous metal path from the root conductive region 114 to each of the branch conductive regions 116. Also, the root conductive region 114 may extend in a direction substantially opposite the direction in which the branch conductive regions 116 branch or fan out. The root conductive region 114 may extend in that direction to, for example, an edge of the power distribution layer 104. A metal path or trace 120 may extend from the root conductive region 114 to, for example, another edge (not shown) of the power distribution layer 104. Nevertheless, in other examples (not shown) such a trace or extension may be absent. For example, a portion of a power delivery region may extend in the direction opposite the fanning-out direction and terminate at a root conductive region.

Each branch conductive region 116 may be insulated from other branch conductive regions 116 by non-conductive regions or channels 122. That is, each branch conductive region 116 is separated from and thus electrically insulated from an adjacent branch conductive region 116 by a channel 122. Accordingly, the channels 122 may branch or fan out from the root conductive region 114. Stated conversely, the channels 122 may converge or otherwise end together at the root conductive region 114, which thus electrically couples the branch conductive regions 116 together. The channels 122 may branch or fan out in a manner corresponding to the branching or fanning out of the branch conductive regions 116. In an example in which the power distribution layer 104 is formed on or against a non-conductive layer, the channels 122 may extend (not shown) from a surface of the power distribution layer 104 through the entire thickness of the power distribution layer 104 to a surface of the non-conductive layer. Stated another way, the channels 122 may have the form of breaks or fractures in what would otherwise be a continuous metal region. Each channel 122 is thus a region of the power distribution layer 104 devoid of metal.

Each of the branch conductive regions 116 may have at least one of a number of vias 124, which serve as inter-layer power delivery connections. In FIGS. 1-2 the vias 124 are depicted in broken line to indicate that the vias 124 may have any length, depending upon the number of other layers 110, 112, etc., they may extend through. The vias 124 may electrically couple the branch conductive regions 116 to corresponding power pads 126 (FIG. 1) on the top layer 106. For example: a first via 124A may electrically couple the first branch conductive region 116A to a first power pad 126A; a second via 124B may electrically couple the second branch conductive region 116B to a second power pad 126B; a third via 124C may electrically couple the third branch conductive region 116C to a third power pad 126C; a fourth via 124D may electrically couple fourth branch conductive region 116D to a fourth power pad 126D; and a fifth via 124E may electrically couple the fifth branch conductive region 116E to a fifth power pad 126E. The vias 124 may be electrically insulated from (i.e., not make contact with) any of the other layers 110 or 112 that may be metal.

A system-on-a-chip or "SoC" 128 (FIGS. 1-2) may be mounted on the top layer 106. In other examples (not shown), one or more other integrated circuit (chip) packages may be mounted on the top layer 106 in addition to, or alternatively to, the SoC 128. As mounted on the top layer 106, power receiving connections 130 (FIG. 2) of the SoC 128, such as solder balls of a ball grid array, may be electrically coupled to (e.g., soldered to) corresponding power pads 126 (FIG. 1). The vias 124 thus may electrically couple the branch conductive regions 116 to the power receiving connections 130 of the SoC 128. The vias 124 may also be connected to corresponding decoupling capacitors 131 mounted on the bottom layer 108. Nevertheless, in other examples (not shown) such decoupling capacitors may be mounted on the same outer layer or side of a PCB as an SoC or a PMIC. Still more generally, any of the above-described components, including an SoC, a PMIC, decoupling capacitors, etc., may be mounted on either of the outer layers or sides of the PCB, either of which may be referred to in other examples as the "top layer" or "bottom layer."

Although not shown for purposes of clarity, the SoC 128 or other integrated circuit packages or circuitry may additionally have signal connections that are similarly electrically coupled to (e.g., soldered to) corresponding signal pads on the top layer 106 or bottom layer 108. Although similarly not shown for purposes of clarity, such signal pads may be coupled (e.g., by additional vias) to signal traces of one or more conductive layers of the PCB 102. Whereas the branch conductive regions 116, vias 124, and power pads 126 may be configured to deliver electrical power to the SoC 128 or other chip packages, such signal traces, signal vias, and signal pads may be configured to carry data, control signals, clock signals, analog signals, or any other type of signals, between signal inputs and outputs of various chip packages or other circuitry mounted on the PCB 102, as understood by one of ordinary skill in the art.

Figure 4:
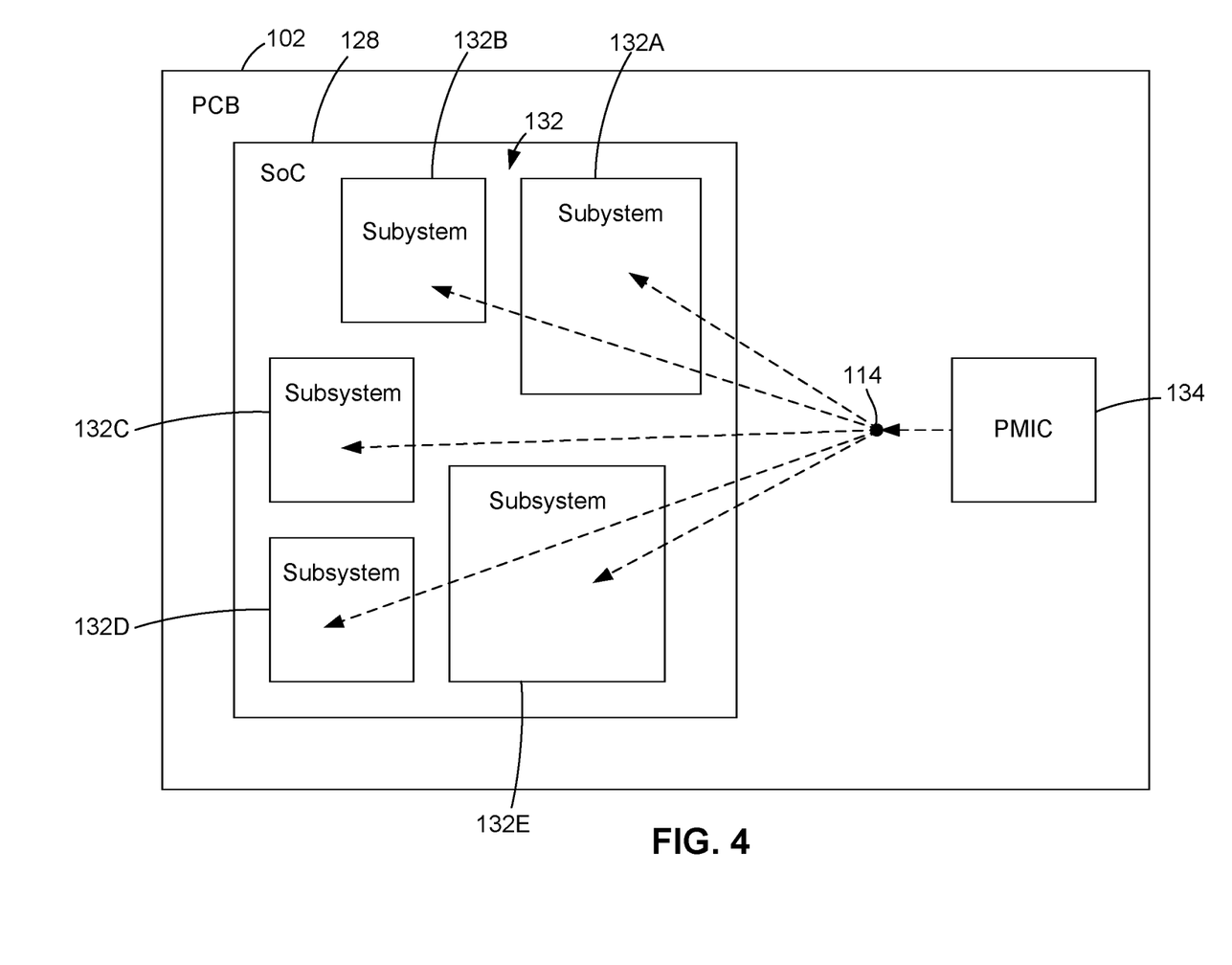
FIG. 4 is a block diagram of a system for delivering power from power supply circuitry to a system-on-a-chip ("SoC"), in accordance with exemplary embodiments.

As shown in FIG. 4 in block diagram form, the SoC 128 may include multiple subsystems 132, such as a first subsystem 132A, a second subsystem 132B, a third subsystem 132C, a fourth subsystem 132D, and a fifth subsystem 132E. Each of the subsystems 132 may comprise circuitry configured to receive power delivered through the power distribution layer 104 (FIGS. 1-3). For example, with additional reference again to FIG. 1: the first subsystem 132A (FIG. 4) may receive power through a power supply connection that includes the first branch conductive region 116A, the first via 124A, and the first power pad 126A; the second subsystem 132B (FIG. 4) may receive power through a power supply connection that includes the second branch conductive region 116B, the second via 124B, and the second power pad 126B; the third subsystem 132C (FIG. 4) may receive power through a power supply connection that includes the third branch conductive region 116C, the third via 124C, and the third power pad 126C; the fourth subsystem 132D (FIG. 4) may receive power through a power supply connection that includes the fourth branch conductive region 116D, the fourth via 124D, and the fourth power pad 126D; and the fifth subsystem 132E (FIG. 4) may receive power through a power supply connection that includes the fifth branch conductive region 116E, the fifth via 124E, and the fifth power pad 126E.

A power management integrated circuit ("PMIC") 134 or other power supply circuitry may be mounted on the PCB 102 along with the SoC 128. In some examples the PMIC 134 and SoC 128 may be in the form of separate packages mounted on the PCB 102, while in other examples the PMIC 134, SoC 128 and PCB 102 may be packaged together (e.g., a multi-chip package). A supply voltage output of the PMIC 134 may be coupled to the root conductive region 114 (depicted in circuit node form in FIG. 4). For example, the metal trace 120 (FIG. 1) of the power distribution layer 104 may couple the supply voltage output of the PMIC 134 to the root conductive region 114. In operation, the power supplied by the PMIC 134 may be distributed to the various subsystems 132 through the corresponding power supply connections, as conceptually indicated by the broken-line arrows in FIG. 4.

The power delivery network ("PDN") isolation solutions described herein may improve power supply isolation between various subsystems 132 or other circuitry. In operation, some of the subsystems 132, which may be referred to as noise "aggressor" subsystems, may undesirably induce noise on their power supply connections. Others of the subsystems 132 may be sensitive to such noise. But for the PDN isolation solutions described herein, the operation of such other subsystems 132, which may be referred to as noise "victim" subsystems, may be impaired by such noise on their power supply connections. The following example may be illustrative of principles of the PDN isolation solutions described herein.

One of the subsystems 132, such as, for example, the subsystem 132C, may be a noise aggressor with respect to another of the subsystems 132, such as, for example, the subsystem 132D. Referring again to FIG. 3, in operation, the exemplary aggressor subsystem 132C may induce noise on the branch conductive region 116C through its via 124C. Meanwhile, the exemplary victim subsystem 132D could be sensitive to such noise on its via 124D, were such noise present on the branch conductive region 116D (and thus present on the via 124D). However, note that the shortest conductive path 136 from the via 124C to the via 124D, which passes through the root conductive region 114, is substantially longer than the shortest direct (i.e., linear) path 138 from the via 124C to the via 124D, which crosses one of the non-conductive channels 122. The longer path 136 may have substantially greater inductance than a shorter path, such as a conductive path that would exist co-linearly with the direct path 138 but for such a conductive path being prevented by the non-conductive channel 122. This increased inductance may improve noise isolation.

Figure 5:
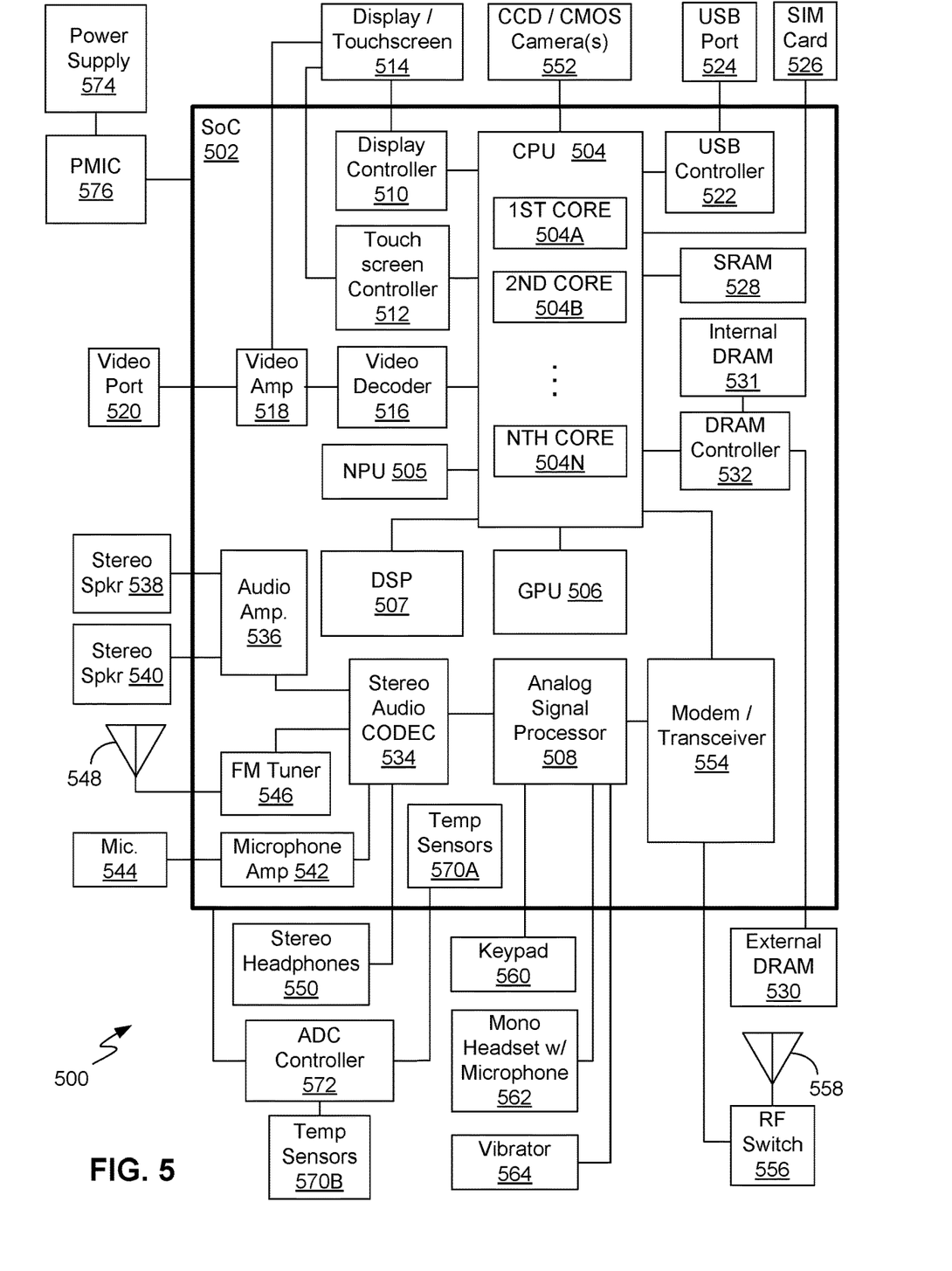
FIG. 5 is a block diagram of a portable computing device, in accordance with exemplary embodiments.

FIG. 5 illustrates an example of a PCD 500, such as a mobile phone or smartphone, in which exemplary embodiments of PDN isolation may be provided. For purposes of clarity, some data buses, interconnects, signals, etc., are not shown in FIG. 5. Although the PCD 500 is shown as an example, other embodiments of PDN isolation may be provided in other types of computing devices or systems.

The PCD 500 may include an SoC 502. The SoC 502 may be an example of the above-described SoC 128 (FIGS. 1, 2 and 4). The SoC 502 may include a central processing unit ("CPU") 504, a neural processing unit ("NPU") 505, a graphics processing unit ("GPU") 506, a digital signal processor ("DSP") 507, an analog signal processor 508, a modem/modem subsystem 554, or other processors. The CPU 504 may include one or more CPU cores, such as a first CPU core 504A, a second CPU core 504B, etc., through an Nth CPU core 504N. The foregoing processors may be examples of the subsystems 132 described above with regard to FIG. 4.

A display controller 510 and a touch-screen controller 512 may be coupled to the CPU 504. A touchscreen display 514 external to the SoC 502 may be coupled to the display controller 510 and the touch-screen controller 512. The PCD 500 may further include a video decoder 516 coupled to the CPU 504. A video amplifier 518 may be coupled to the video decoder 516 and the touchscreen display 514. A video port 520 may be coupled to the video amplifier 518. A universal serial bus ("USB") controller 522 may also be coupled to CPU 504, and a USB port 524 may be coupled to the USB controller 522. A subscriber identity module ("SIM") card 526 may also be coupled to the CPU 504.

One or more memories may be coupled to the CPU 504. The one or more memories may include both volatile and non-volatile memories. Examples of volatile memories include static random access memory ("SRAM") 528 and dynamic random access memory ("DRAM") 530 and 531. Such memories may be external to the SoC 502, such as the DRAM 530, or internal to the SoC 502, such as the DRAM 531. A DRAM controller 532 coupled to the CPU 504 may control the writing of data to, and reading of data from, the DRAMs 530 and 531.

A stereo audio CODEC 534 may be coupled to the analog signal processor 508. Further, an audio amplifier 536 may be coupled to the stereo audio CODEC 534. First and second stereo speakers 538 and 540, respectively, may be coupled to the audio amplifier 536. In addition, a microphone amplifier 542 may be coupled to the stereo audio CODEC 534, and a microphone 544 may be coupled to the microphone amplifier 542. A frequency modulation ("FM") radio tuner 546 may be coupled to the stereo audio CODEC 534. An FM antenna 548 may be coupled to the FM radio tuner 546. Further, stereo headphones 550 may be coupled to the stereo audio CODEC 534. Other devices that may be coupled to the CPU 504 include one or more digital (e.g., CCD or CMOS) cameras 552.

The modem or RF transceiver 554 may be coupled to the analog signal processor 508 and the CPU 504. An RF switch 556 may be coupled to the RF transceiver 554 and an RF antenna 558. In addition, a keypad 560, a mono headset with a microphone 562, and a vibrator device 564 may be coupled to the analog signal processor 508.

The SoC 502 may have one or more internal or on-chip thermal sensors 570A and may be coupled to one or more external or off-chip thermal sensors 570B. An analog-to-digital converter controller 572 may convert voltage drops produced by the thermal sensors 570A and 570B to digital signals. A power supply 574 and a PMIC 576 may supply power to the SoC 502. The PMIC 576 may be an example of the PMIC 134 described above with regard to FIG. 4.

Although the block diagram representation in FIG. 5 naturally does not depict a PCB, it should be understood that some or all of the above-described components may be mounted on a PCB and supplied with power therefrom in accordance with the principles described above with regard to FIGS. 1-4.

Implementation examples are described in the following numbered clauses:

1. A system for power delivery network isolation, comprising:
    a printed circuit board comprising a plurality of planar layers, a power distribution layer of the plurality of layers comprising a root conductive region and a plurality of branch conductive regions fanning out from the root conductive region, each branch conductive region insulated from other branch conductive regions by a non-conductive region, each branch conductive region having at least one of a plurality of power delivery connections.
2. The system of clause 1, wherein all branch conductive regions are within a power delivery region conductively coupled with and immediately adjacent the root conductive region.
3. The system of clause 1 or 2, wherein the power distribution layer consists of a layer of metal formed on a non-conductive layer, and each non-conductive region comprises a channel devoid of the metal.
4. The system of any of clauses 1-3, wherein the plurality of power delivery connections comprise a plurality of inter-layer vias.
5. The system of any of clauses 1-4, wherein the power distribution layer is between a top layer of the plurality of layers and a bottom layer of the plurality of layers, and the plurality of vias are coupled to a corresponding plurality of power pads on the top layer.
6. The system of any of clauses 1-5, further comprising an integrated circuit package mounted on the top layer, the integrated circuit package having a power receiving connection coupled to a power pad.
7. The system of any of clauses 1-6, wherein the integrated circuit package comprises a system-on-a-chip ("SoC") having a plurality of subsystems, the power receiving connection of a first subsystem coupled to a first one of the plurality of vias, and the power receiving connection of a second subsystem coupled to a second one of the vias.
8. The system of any of clauses 1-7, further comprising a plurality of decoupling capacitors mounted on the bottom layer and coupled to a corresponding plurality of the vias.
9. The system of any of clauses 1-8, further comprising power supply circuitry mounted on the top layer, the power supply circuitry having a power supply output coupled to the root conductive region.
10. The system of any of clauses 1-9, wherein the power supply circuitry comprises a power management integrated circuit.
11. The system of any of clauses 1-10, wherein the printed circuit board is included in a portable computing device.
12. A system for power delivery network isolation, comprising:
    a printed circuit board comprising a plurality of planar layers, a power distribution layer of the plurality of layers comprising a root conductive region and a plurality of branch conductive regions coupled to the root conductive region, each branch conductive region insulated from other branch conductive regions by a non-conductive region, each branch conductive region having at least one of a plurality of power delivery connections;
    signal aggressor circuitry mounted on the printed circuit board, the signal aggressor circuitry having a first power receiving connection coupled to a first one of the power delivery connections; and
    signal victim circuitry mounted on the printed circuit board, the signal victim circuitry having a second power receiving connection coupled to a second one of the power delivery connections, wherein a shortest conductive path from the first power receiving connection to the second power receiving connection through the root conductive region is longer than the shortest direct path from the first power receiving connection to the second power receiving connection across at least one of the non-conductive regions.

13. The system of clause 12, wherein the signal aggressor circuitry and the signal victim circuitry are subsystems of a system-on-a-chip ("SoC").

14. The system of clause 12 or 13, wherein:
the plurality of power delivery connections comprise a plurality of inter-layer vias; and
the power distribution layer is between a top layer of the plurality of layers and a bottom layer of the plurality of layers, the plurality of vias are coupled to a corresponding plurality of power pads on a surface of the top layer, the first power receiving connection is coupled to a first one of the plurality of power pads, and the second power receiving connection is coupled to a second one of the power pads.

15. The system of any of clauses 12-14, further comprising power supply circuitry mounted on the top layer, the power supply circuitry having a power supply output connected to a metal trace extending contiguously between the power supply output and the root conductive region.

16. The system of clause any of clauses 12-15, wherein the power supply circuitry comprises a power management integrated circuit.

17. The system of clause any of clauses 12-16, further comprising a plurality of decoupling capacitors mounted on the bottom layer and coupled to a corresponding plurality of the vias.

18. The system of clause any of clauses 12-17, wherein the printed circuit board, the signal aggressor circuitry, and the signal victim circuitry are included in a portable computing device.

19. A system for power delivery network isolation, comprising:
a printed circuit board comprising a plurality of planar layers, a power distribution layer of the plurality of layers comprising a root conductive region and a plurality of branch conductive regions coupled to the root conductive region, each branch conductive region insulated from other branch conductive regions by a non-conductive region, each branch conductive region having at least one of a plurality of power delivery connections;
power supply circuitry mounted on a top layer of the plurality of layers and having a power output coupled to the root conductive region; and
a system-on-a-chip ("SoC") mounted on the top layer, the SoC having a plurality of subsystems, the power receiving connection of a first subsystem coupled to a first one of the plurality of power delivery connections, and the power receiving connection of a second subsystem coupled to a second one of the plurality of power delivery connections.

20. The system of clause 19, wherein the plurality of power delivery connections comprise a plurality of inter-layer vias, the plurality of vias are coupled to a corresponding plurality of power pads on the top layer, the power receiving connection of the first subsystem is coupled to a first one of the plurality of power pads, and the power receiving connection of the second subsystem is coupled to a second one of the plurality of power pads.

21. The system of clause 19 or 20, further comprising a plurality of decoupling capacitors mounted on a bottom layer of the plurality of layers and coupled to a corresponding plurality of the vias.

22. The system of any of clauses 19-21, wherein the printed circuit board, the power supply circuitry, and the SoC are included in a portable computing device.

23. A system for power delivery network isolation, comprising:
means for receiving power from power supply circuitry on a printed circuit board;
means for delivering the power to a plurality of circuits on the printed circuit board; and
means for isolating noise from the power delivered to each of the plurality of circuits from the power delivered to others of the plurality of circuits.

24. The system of clause 23, wherein the means for receiving power comprises a root region of metal in a power distribution layer of the printed circuit board.

25. The system of clause 23 or 24, wherein the means for delivering power comprises a plurality of branch regions of the metal in the power distribution layer fanning out from the root region.

26. The system of any of clauses 23-25, wherein the means for isolating noise comprises regions of the metal separated by channels devoid of the metal extending to the root region.

27. The system of any of clauses 23-26, wherein the means for delivering power further comprises a plurality of inter-layer vias.

28. The system of any of clauses 23-27, further comprising a system-on-a-chip ("SoC") mounted on the printed circuit board, the SoC containing the plurality of circuits.

29. The system of any of clauses 23-28, wherein the SoC and the power supply circuitry are mounted on atop layer of the printed circuit board, and the power distribution layer is between the top layer and a bottom layer of the printed circuit board.

30. The system of any of clauses 23-29, further comprising a plurality of decoupling capacitors mounted on the bottom layer and coupled to a corresponding plurality of the vias.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A system for power delivery network isolation, comprising:
a printed circuit board comprising a plurality of planar layers, a power distribution layer of the plurality of layers comprising a root conductive region and a plurality of branch conductive regions fanning out from the root conductive region, each branch conductive region insulated from other branch conductive regions by a non-conductive region, each branch conductive region having at least one of a plurality of power delivery connections, wherein a shortest conductive path from a first power receiving connection to a second power receiving connection through the root conductive region is longer than the shortest direct path from the first power receiving connection to the second power receiving connection across at least one of the non-conductive regions;

the power distribution layer consists of a layer of metal formed on a non-conductive layer, and each non-conductive region comprises a channel devoid of the metal;

each channel comprises a first rectilinear section closest to the root conductive region and which is parallel to neighboring first rectilinear sections of other neighboring channels; each channel further comprises a second rectilinear section extending at an obtuse angle relative to a respective first rectilinear section; each branch conductive region comprising a planar region having at least one edge defined by one of the second rectilinear sections of one channel.

2. The system of claim 1, wherein all branch conductive regions are within a power delivery region conductively coupled with and immediately adjacent the root conductive region.

3. The system of claim 1, wherein the plurality of power delivery connections comprise a plurality of inter-layer vias.

4. The system of claim 1, further comprising a power supply circuitry mounted on the top layer, the power supply circuitry having a power supply output coupled to the root conductive region.

5. The system of claim 4, wherein the power supply circuitry comprises a power management integrated circuit.

6. The system of claim 1, wherein the printed circuit board is included in a portable computing device.

7. The system of claim 3, wherein the power distribution layer is between a top layer of the plurality of layers and a bottom layer of the plurality of layers, and the plurality of vias are coupled to a corresponding plurality of power pads on the top layer.

8. The system of claim 7, further comprising an integrated circuit package mounted on the top layer, the integrated circuit package having a power receiving connection coupled to a power pad.

9. The system of claim 7, further comprising a plurality of decoupling capacitors mounted on the bottom layer and coupled to a corresponding plurality of the vias.

10. The system of claim 8, wherein the integrated circuit package comprises a system-on-a-chip ("SoC") having a plurality of subsystems, the power receiving connection of a first subsystem coupled to a first one of the plurality of vias, and the power receiving connection of a second subsystem coupled to a second one of the vias.

11. A system for power delivery network isolation, comprising:
a printed circuit board comprising a plurality of planar layers, a power distribution layer of the plurality of layers comprising a root conductive region and a plurality of branch conductive regions coupled to the root conductive region, each branch conductive region insulated from other branch conductive regions by a non-conductive region, each branch conductive region having at least one of a plurality of power delivery connections;
a signal aggressor circuitry mounted on the printed circuit board, the signal aggressor circuitry having a first power receiving connection coupled to a first one of the power delivery connections; and
a signal victim circuitry mounted on the printed circuit board, the signal victim circuitry having a second power receiving connection coupled to a second one of the power delivery connections, wherein a shortest conductive path from the first power receiving connection to the second power receiving connection through the root conductive region is longer than the shortest direct path from the first power receiving connection to the second power receiving connection across at least one of the non-conductive regions;
the power distribution layer consists of a layer of metal formed on a non-conductive layer, and each non-conductive region comprises a channel devoid of the metal;
each channel comprises a first rectilinear section closest to the root conductive region and which is parallel to neighboring first rectilinear sections of other neighboring channels; each channel further comprises a second rectilinear section extending at an obtuse angle relative to a respective first rectilinear section; each branch conductive region comprising a planar region having at least one edge defined by one of the second rectilinear sections of one channel.

12. The system of claim 11, wherein the signal aggressor circuitry and the signal victim circuitry are subsystems of a system-on-a-chip ("SoC").

13. The system of claim 12, wherein:
the plurality of power delivery connections comprise a plurality of inter-layer vias; and
the power distribution layer is between a top layer of the plurality of layers and a bottom layer of the plurality of layers, the plurality of vias are coupled to a corresponding plurality of power pads on a surface of the top layer, the first power receiving connection is coupled to a first one of the plurality of power pads, and the second power receiving connection is coupled to a second one of the power pads.

14. The system of claim 13, further comprising a power supply circuitry mounted on the top layer, the power supply circuitry having a power supply output connected to a metal trace extending contiguously between the power supply output and the root conductive region.

15. The system of claim 13, further comprising a plurality of decoupling capacitors mounted on the bottom layer and coupled to a corresponding plurality of the vias.

16. The system of claim 13, wherein the printed circuit board, the signal aggressor circuitry, and the signal victim circuitry are included in a portable computing device.

17. The system of claim 14, wherein the power supply circuitry comprises a power management integrated circuit.

18. A system for power delivery network isolation, comprising:
a printed circuit board comprising a plurality of planar layers, a power distribution layer of the plurality of layers comprising a root conductive region and a plurality of branch conductive regions coupled to the root conductive region, each branch conductive region insulated from other branch conductive regions by a non-conductive region, each branch conductive region having at least one of a plurality of power delivery connections;
a power supply circuitry mounted on a top layer of the plurality of layers and having a power output coupled to the root conductive region; and
a system-on-a-chip ("SoC") mounted on the top layer, the SoC having a plurality of subsystems, a first power receiving connection of a first subsystem coupled to a first one of the plurality of power delivery connections, and a second power receiving connection of a second subsystem coupled to a second one of the plurality of power delivery connections, wherein a shortest conductive path from the first power receiving connection to the second power receiving connection through the root conductive region is longer than the shortest direct path from the first power receiving connection to the second power receiving connection across at least one of the non-conductive regions;

the power distribution layer consists of a layer of metal formed on a non-conductive layer, and each non-conductive region comprises a channel devoid of the metal;

each channel comprises a first rectilinear section closest to the root conductive region and which is parallel to neighboring first rectilinear sections of other neighboring channels; each channel further comprises a second rectilinear section extending at an obtuse angle relative to a respective first rectilinear section; each branch conductive region comprising a planar region having at least one edge defined by one of the second rectilinear sections of one channel.

19. The system of claim 18, wherein the plurality of power delivery connections comprise a plurality of interlayer vias, the plurality of vias are coupled to a corresponding plurality of power pads on the top layer, the power receiving connection of the first subsystem is coupled to a first one of the plurality of power pads, and the power receiving connection of the second subsystem is coupled to a second one of the plurality of power pads.

20. The system of claim 18, wherein the printed circuit board, the power supply circuitry, and the SoC are included in a portable computing device.

21. The system of claim 19, further comprising a plurality of decoupling capacitors mounted on a bottom layer of the plurality of layers and coupled to a corresponding plurality of the vias.

* * * * *